US000001019H

United States Statutory Invention Registration [19]

[11] Reg. Number: H1019

Feldman et al. [43] Published: Feb. 4, 1992

[54] METHOD FOR FORMING IMAGES ON PLAIN PAPER

[75] Inventors: Lyudmila Feldman, Centerville; T. Kay Kiser, Kettering, both of Ohio

[73] Assignee: The Mead Corporation, Dayton, Ohio

[21] Appl. No.: 463,182

[22] Filed: Jan. 10, 1990

[51] Int. Cl.[5] ..... G03C 1/72
[52] U.S. Cl. ..... 430/138

[56] References Cited

U.S. PATENT DOCUMENTS 4,622,282 11/1986 Head et al. ..... 430/138
4,701,397 10/1987 Roarke et al. ..... 430/138
4,751,165 6/1988 Roarke et al. ..... 430/138

FOREIGN PATENT DOCUMENTS 2202641 9/1988 United Kingdom .

OTHER PUBLICATIONS

"One Step Lamination and Development of Receiver Sheet for Imaging Systems Employing Photohardenable Microcapsules", L. Feldman, *Research Disclosure*, Feb. 1989, 2 pp.

*Primary Examiner*—Robert L. Stoll
*Assistant Examiner*—C. Harris
*Attorney, Agent, or Firm*—Thompson, Hine and Flory

[57] ABSTRACT

A method for forming images on a non-reactive substrate such as plain paper is disclosed, comprising the steps of: image-wise exposing an imaging sheet, said imaging sheet comprising a support having a layer of photosensitive microcapsules on the surface thereof, said microcapsules containing a photohardenable or photosoftenable composition including a photoinitiator, and a color precursor; assembling said image-wise exposed imaging sheet with a developer-donor sheet; subjecting said assembly to a uniform rupturing force to cause said photosensitive microcapsules to rupture and transfer an image-wise pattern of said color precursor to said developer-donor sheet thereby forming an image thereon; separating said imaging sheet from said developer-donor sheet; assembling said developer-donor sheet bearing said image with a sheet of plain paper to form a second assembly; and subjecting said second assembly to heat and a uniform force to transfer said developer to said non-reactive substrate.

14 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD FOR FORMING IMAGES ON PLAIN PAPER

BACKGROUND OF THE INVENTION

1. Field of the Invention

The present invention relates to a method for forming images using a cylithographic imaging system. More particularly it relates to a method for forming images on plain paper and other non-reactive substances.

2. Description of the Prior Art

Photosensitive imaging systems employing microencapsulated radiation-sensitive compositions (also known as cylithographic imaging systems) are the subject of commonly assigned U.S. Pat. Nos. 4,399,209, 4,772,541 and 4,842,976 to The Mead Corporation. These imaging systems employ an imaging sheet including a layer of microcapsules containing a photosensitive composition in the internal phase. In the most typical embodiments, the photosensitive composition is a photopolymerizable composition including a polyethylenically unsaturated compound and a photoinitiator. Encapsulated with this composition is a color precursor. Exposure image-wise hardens the internal phase of the microcapsules. Following exposure, the imaging sheet is subjected to a uniform rupturing force by passing the sheet in contact with a developer sheet through the nip between a pair of pressure rollers whereupon the color precursor is transferred to the developer sheet where it reacts to form an image.

Techniques have been disclosed for forming images on plain paper. In U.S. Pat. No. 4,622,282 issued Nov. 11, 1986 a process is disclosed which comprises image-wise exposing an imaging sheet to actinic radiation. The imaging sheet includes a support having a layer of microcapsules containing a photosensitive composition and a color precursor on the surface. The sheet is subjected to a uniform rupturing force in contact with a sheet of plain paper. The chromogenic material is image-wise transferred to the sheet of plain paper to form a latent image and the surface of the sheet of plain paper carrying the latent image is then contacted with a developer material to form a visible image. In one embodiment a paper is contacted with a rotating developer applicator brush. The brush applies a developer material onto the surface of paper where it reacts with the chromogenic material and produces the color image. However, brush application of the developer is disadvantageous as it is often accompanied by streaking, loss of resolution and cross-colorization due to brush contamination, wherein the brush carries precursor and/or developer across the surface of the paper to undesired areas.

In accordance with another embodiment of the invention described in U.S. Pat. No. 4,622,282, the developer material is provided on the surface of the imaging sheet with the microcapsules containing the chromogenic material. The developer is provided in admixture with the microcapsules in a single layer on the surface of the imaging sheet or in a separate layer underlying the layer of microcapsules With the developer present on the surface of the imaging sheet, images are formed by simply image-wise exposing the sheet to actinic radiation, subjecting the sheet to a uniform rupturing force in contact with plain paper, and effecting transfer to the surface of the plain paper. The developer and the chromogenic material begin reacting as they are transferred to the surface of the plain paper.

U.S. Pat. No. 4,701,397 teaches another method for forming images on plain paper wherein a layer of microcapsules and developer is area-wise transferred to the surface of a plain sheet of paper to form an image. In this method, the microcapsules and developer are coated in a single layer or as separate layers on a thin polymeric film. The sheet is image-wise exposed to actinic radiation, assembled with a sheet of plain paper and subjected to pressure whereupon, in the image areas, the layer of developer is transferred (selectively adhered) to the paper and an image is formed.

U.K. Pat. Application No. 2 202 641 discloses a method for copying on paper or cloth using the cylithographic system wherein a wax is incorporated in the developer layer. The method relies upon two transfer steps. In the first, the image-wise exposed imaging sheet is assembled with a sheet of the developer on the surface of a temporary support, pressure is applied and a real image is formed on the developer sheet. The developer sheet is juxtaposed a sheet of paper and pressure is applied whereupon the developer layer is transferred to the paper surface.

SUMMARY OF THE INVENTION

This invention relates to an improvement in a process for forming images which comprises the steps of image-wise exposing an imaging sheet including a support having a layer of photosensitive microcapsules on the surface thereof, said microcapsules containing a photohardenable or photosoftenable composition and a color precursor. The imaging sheer is assembled with a web carrying a layer of a developer (hereafter "developer-donor sheet") and the microcapsules are subjected to a uniform rupturing force. The color precursor is released image-wise from the microcapsules and transferred to the developer layer where it reacts to produce an image. The web carrying the developer layer is subsequently assembled with a sheet of plain paper and subjected to heat and pressure whereupon the developer layer having the images therein is transferred to the surface of the sheet as a film.

The present invention relates to an improvement in the foregoing process wherein the developer layer consists essentially of a thermoplastic developer resin and more particularly, a metallated phenolic resin. The developer layer does not contain a wax or a release agent as disclosed in U.K. Application No. 2 202 641. To enhance the reaction between the developer resin and the color precursor, the developer resin is preferably provided as a layer of finely divided resin particles. It is believed that the spaces present among the particles in the layer form a network of capillaries which draws the color precursor into the developer layer and provides greater contact between the color precursor and the developer thereby enhancing the reaction between the resin and the color precursor. The finely divided developer resin can be achieved by several methods such as by coating a dispersion of the resin on the donor web and drying.

In accordance with a more preferred embodiment of the invention, an undercoating is provided between the developer layer and the developer-donor web. Upon transfer of the developer layer to the non-reactive substrate such as paper, the undercoating is transferred from the developer-donor web with the developer, upon transfer the undercoating overlies the developer layer. In accordance with this embodiment the undercoating is prepared with one or more agents which improves or modifies the photographic, handling and/or storage characteristics of the image. Examples of such agents include an ultraviolet absorber or an optical brightener to prevent or compensate for yellowing, a matte agent, an oxygen barrier material to improve the archival stability of the image (e.g., the underlayer may be formed from a transferable resin having barrier properties), a scratch resistant film or agent and the like.

This improved imaging process is believed to be advantageous for several reasons. First, because the image is formed on an intermediate receiver or developer-donor on thin film and is not formed directly on plain paper but rather transferred as a film, mottle is reduced or eliminated. This permits one to form high quality images without using the expensive basestocks frequently required in the printing industry. Secondly, in this method, unreacted monomer released from the microcapsules is sandwiched between the non-reactive substrate (e.g., paper) and the developer layer where it cannot come into contact with the skin upon handling. This is believed to be advantageous because some unreacted monomers may be irritants. Third, it is desirable to form images having a glossy appearance. In previous methods, the developer resin is heated (glossed) to cause it to film out. In this method, the developer is cast onto the paper or nonreactive substrate from a film and the external surface of the developer layer possesses the smoothness of the film from which it is cast. Finally, because the microcapsules and the developer can both be carried on thin, smooth, and compliant plastic films, substantially less pressure is required to rupture the microcapsules and exude the color precursor. This simplifies the design of the copier or printer and more particularly it simplifies pressure roller design as even lineal pressures are easier to establish.

DETAILED DESCRIPTION OF THE DRAWINGS

Figure 1:
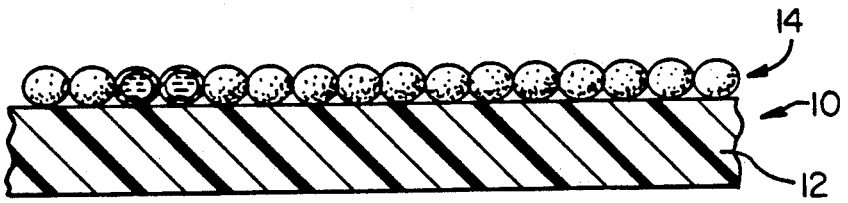
FIG. 1 is a schematic illustration in cross-section of an imaging sheet used in accordance with the present invention.

The present invention enables plain paper and other non-reactive supports to be utilized with a cylithographic imaging system. By "non-reactive substrate" is meant paper, film, board and the like which does not have a developer composition or a similar reactive material associated with the substrate, however, this definition is not meant to exclude substrates which are sized or otherwise surface treated to enhance transfer of the developer, limit feathering or penetration, enhance adhesion or affinity for the developer, etc. A particularly convenient paper to use is xerographic bond paper.

In addition to paper, the method of the present invention is useful in forming images on other non-reactive substrates. More particularly, the invention is useful in forming images on transparent films such as PET and more particularly xerographic transparencies. In addition, the invention may be used to form images on certain photographic base papers, e.g., papers carrying a layer of polyethylene on the surface. While these papers are designed to receive photographic emulsions, in the present invention they may be the receiver surface for the developer layer transferred from the developer-donor. If desired or necessary, these photographic base papers may also be inverted and the developer layer may be transferred to the paper stock while the polyethylene functions to seal the back surface.

The method of this invention is also useful in forming images on non-conventional substrates such as glass, cardboard, container board, etc. One of the advantages of this process as pointed out above is that high quality images may be obtained on low quality base stocks. For example, it may be desirable to form images on container board in preparing mock-up container designs. Images can also be formed on plastic substrates of the type used in credit cards to form credit cards, identification badges and the like.

For forming high quality images, so-called magazine stock and other coated papers may be used in the present invention Bank check stock may also be used, for example, using the invention it is possible to put the picture of the payor on the check to prevent fraud. This may also be helpful in preparing credit cards as previously noted.

Imaging systems utilizing photosensitive microcapsules are described in U.S. Pat. Nos. 4,399,209, 4,440,846, 4,772,530 and 4,772,541 and 4,842,976 (full color). To the extent necessary, the teachings of these patents with respect to the preparation of microcapsules, image-forming agents, developer materials, exposure techniques, microencapsulation techniques, color precursors, photosensitive compositions, initiator systems, etc. are hereby incorporated by reference. Furthermore, even when using image-forming agents such as dyes and pigments which do not require a developer, the use of intermediate transfer is desirable as it provides an image with little or no mottle. This is difficult to achieve in the printing industry as the industry relies upon very expensive basestocks for this purpose.

FIG. 1 illustrates one example of a photographic imaging sheet useful in the present invention. Therein an imaging sheet 10 is shown comprising a substrate 12 coated with a layer of microcapsules 14. Preferably the layer of microcapsules contains three sets of microcapsules sensitive to red, green and blue light respectively and containing cyan, magenta and yellow image-forming agents as described in U.S. Pat. No. 4,772,541. The substrate 12 may be aluminized PET (polyethylene terephthalate) which is advantageous because light incident the microcapsule layer 14 passing through the layer is reflected back into the microcapsules. This makes more efficient use of the incident light and in this way improves the film speed of the imaging sheet. Other supports including paper and synthetic films such as PET are also useful as substrates for the imaging sheet.

In selecting a substrate for both the imaging sheet and the developer-donor sheet it is preferred to use the thinnest and smoothest materials which are compliant and can be readily handled within the printer or copier. This reduces the amount of pressure required to rupture the microcapsules and cause the internal phase to exude and transfer to the developer layer. The thicker and less compliant a substrate is, the larger is the area of the pressure nip through which it passes and the greater is the pressure which must be applied to achieve a predetermined lineal pressure. Similarly, the more irregular the surface, the greater is the pressure required to achieve a desired uniform lineal pressure. The preferred substrate, balancing cost and effectiveness, is synthetic films ranging from about 5 to 100 microns and more preferably about 10 to 20 microns in thickness. Thinner films are more difficult to handle and thus less desirable although from the standpoint of simplifying pressure roller design they may be desirable. The developer-donor web will be selected such that the developer layer releases from the web and transfers to paper or the non-reactive substrate in nip 75. The web may be formed from a film which is surface treated to control or limit the degree of adhesion of the developer layer. For example, certain silicone-treated films may be desirable, however, they are not essential. Presently a thin PET film is used. It may be also desirable in certain applications to use a film having a textured surface as this film will impact texture to the donor layer and give the image a matte finish.

The microcapsules are filled with an internal phase 16 comprising a photohardenable (the preferred embodiment) or photosoftenable composition including a photoinitiator, and a color precursor. The color precursor is typically a substantially colorless electron donating compound for which there are examples in the art. In the preferred embodiments of the invention the imaging sheets described in U.S. Pat. No. 4,772,541 are used.

Figure 2:
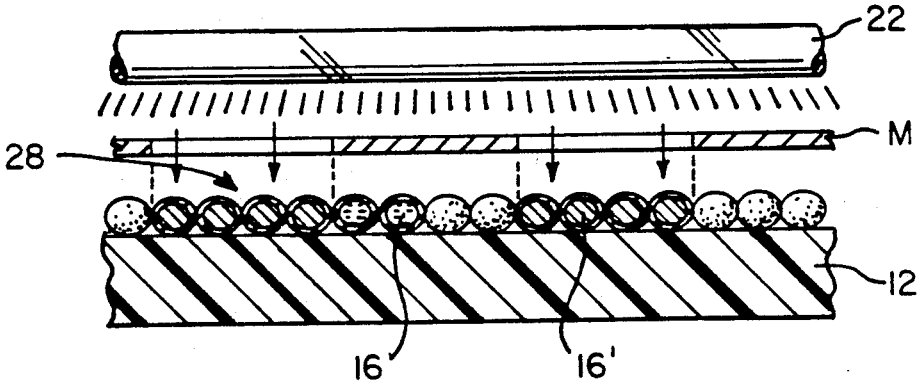
FIG. 2 is a schematic illustration of exposure of the imaging sheet.

Exposure of the imaging sheet 10 by transmission imaging is shown in FIG. 2 wherein a source of radiant energy 22 is positioned adjacent the surface of the imaging sheet 10 with a mask M therebetween. In this illustration the photosensitive material is a positive working radiation curable material. Irradiation of the exposed areas 28 causes the radiation curable material in the internal phase 16 to polymerize, thereby gelling, solidifying or otherwise immobilizing the color precursor. To simplify the illustration, internal phase 16' in the exposed areas 28 is shown as a solid whereas the internal phase 16 remains liquid in the unexposed areas 26. In fact, the internal phase 16' may be semisolid and there may be degrees of solidification ranging from liquid to solid depending upon the amount of exposure any given microcapsule receives.

Figure 3:
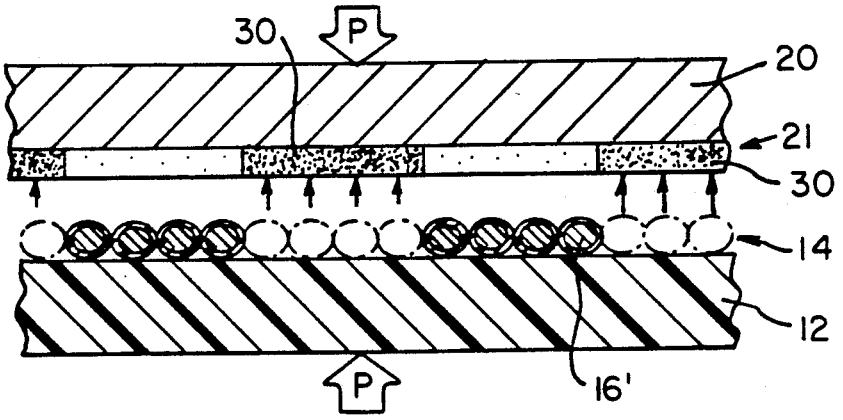
FIG. 3 is a schematic illustration of transfer of the color precursor to a developer-donor sheet to form an image thereon.

Transfer of the color precursor to the developer-donor sheet is shown in FIG. 3 wherein the now exposed imaging sheet 10 is placed with its exposed microcapsule layer 14 in face-to-face contact with developer layer 21 of developer-donor sheet 20 and a lineal pressure P is uniformly applied across the sheets. For simplification, the pressure is shown as rupturing the microcapsules in the unexposed areas 26 and not rupturing the microcapsules in the exposed areas 28. In actuality all the capsules may be ruptured, but the chromogenic material is immobilized by the increased viscosity which results in the internal phase 16' in the exposed areas 28 upon exposure. Typically the capsules are ruptured by passing the imaging sheet 10 and the paper sheet 20 together through a nip between a pair or stack of pressure rollers. This causes the internal phase 16 from the unexposed areas 26 to transfer to the developer-donor sheet 20 as is shown schematically by arrows in FIG. 3. Upon transfer of the internal phase 16 to the sheet 20, the chromogenic material forms a visible image 30 in the developer layer 21.

The visible image is usually the product of an acid-base reaction between the color precursor, which is usually an electron donor, and the developer which is usually an electron acceptor. Alternatively, coupling reactions analogous to those used in color photographic materials or redox color-forming reaction pairs may be used. Some of these alternative systems are described in U.S. Pat. No. 4,399,209.

Figure 4A:
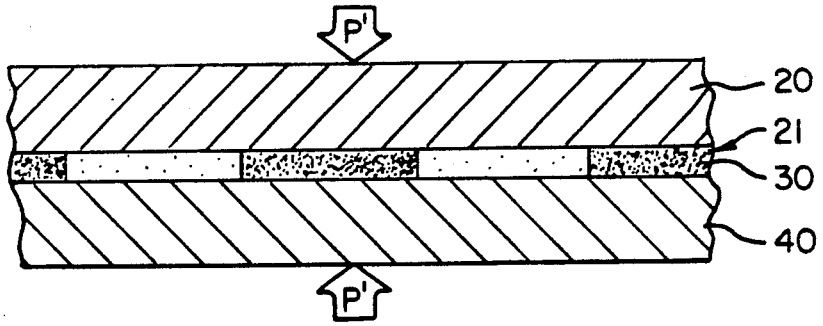
FIG. 4 is a schematic illustration of transfer of the developer as a film to a plain paper sheet.
Figure 4B:
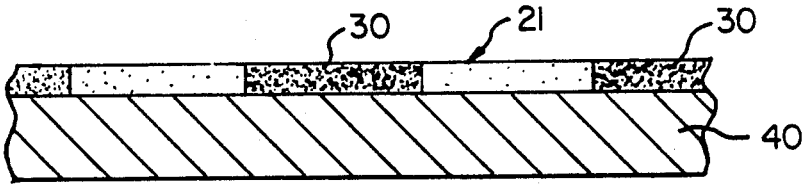

FIG. 4 illustrates transfer of the developer layer 21 to the surface of a paper sheet 40. The developer-donor sheet 20 is positioned with its developer layer 21 adjacent a sheet of paper 30 and a lineal pressure P, is applied. For transfer of the developer material to the plain paper sheet the developer resin is heated prior to or preferably concurrently with its contacting the plain paper sheet and pressure is applied to the sheets. The heating of the developer-donor sheet causes the developer resin present on the developer-donor sheet to become tacky and adhere to the plain paper sheet and release from the developer-donor sheet. The degree of heating necessary to effect transfer of the developer layer will depend on the nature of the developer, the degree of pressure, and the thermal stability of the substrate. Typically, the developer layer will be heated by pressure rollers which are heated to about 70° to 120° C. and more typically 95° to 110° C. The exact temperature will depend on the nature of the materials used.

Those skilled in the art will appreciate that if it is desired to make a two-sided copy this can be accomplished by forming images on a developer-donor sheet which is double the size of the substrate on which the image is formed, e.g., twice the length or twice the width (other formats are also possible) and folding the developer-donor around the receiver to transfer the developer layer to both sides of the receiver.

Figure 5:
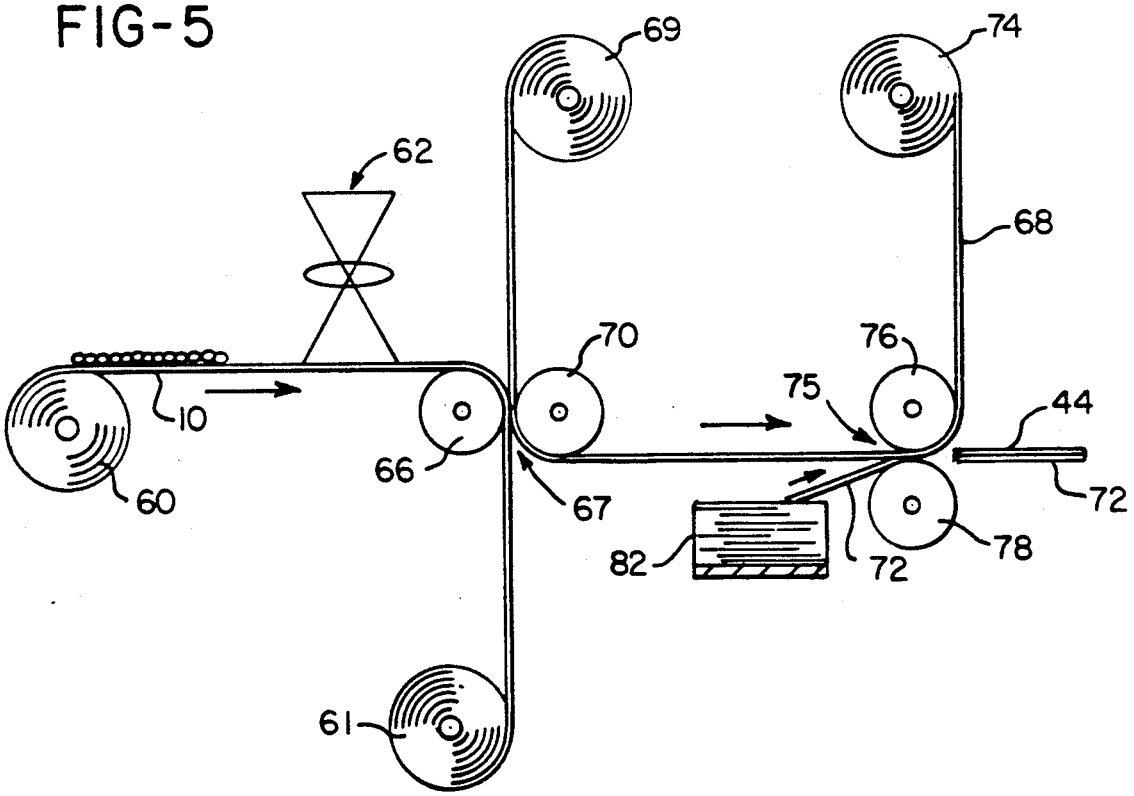
FIG. 5 is a schematic illustration of an apparatus useful in practicing the present invention.

FIG. 5 is a schematic drawing illustrating an apparatus for imaging using plain paper as disclosed in the present invention. Roll 60 dispenses imaging sheet 10 in the direction shown by the arrow and roll 61 subsequently collects imaging sheet 10. As imaging sheet 10 passes under exposure station 62, imaging sheet 10 is exposed in an image-wise pattern causing the microcapsules present on the surface of imaging sheet 10 to photoharden or photosoften in an imagewise pattern depending on the nature of the photosensitive composition they contain. Imaging sheet 10 then passes through the nip 67 between rollers 66 and 70 where it is brought into contact with a developer-donor web 68 having a layer 44 of a developer resin on the surface which is fed from supply roll 69 and collected at take up roll 74. Those skilled in the art will appreciate that the imaging sheet 10 and the developer-donor sheet 68 are preferably supplied in the same cartridge or cassette.

Movement of the developer-donor 68 is in the direction shown by the arrow. When imaging sheet 10 is pressed in the nip between pressure rollers 70 and 66, the pressure exerted by the rollers causes the microcapsules on the surface of imaging sheet 10 to rupture thereby transferring the color precursor to the developer layer 44 on developer-donor sheet 68 whereupon a visible image is formed. One of the advantages of this system is that the substrate for both the developer-donor and the image receiving sheet may be plastic film. This permits the use of much lower pressure in rollers 66 and 70 than when the imaging sheet or the developer-donor sheet substrate is paper. Thus, these rollers may take forms not previously possible due to the lower pressures which are required.

Plain paper sheet 72 next is fed from a supply stack 82 to the nip 75 between pressure rollers 76 and 78. After contact with imaging sheet 10 at pressure nip 67, developer-donor web 68 is conducted around roller 76 through the pressure nip 75. Roller 76 and/or 78 (preferably at least roller 76) is heated. Further because these rollers are essentially laminating rollers, less pressure may be required than required for rollers 66 and 70. As plain paper sheet 72 passes between nip 75 of pressure rollers 76 and 78 in contact with developer-donor sheet 68, the developer 44 on the surface of developer-donor sheet 68 is transferred to paper sheet 72 whereby the image present on the developer-donor sheet 68 is also transferred.

The internal phase of the microcapsules as described above can be encapsulated in any conventional manner. Oil soluble chromogenic materials have been encapsulated in hydrophilic wall-forming materials such as gelatin wall-forming materials (see U.S. Pat. Nos. 2,730,456 and 2,800,457 to Green et al) including gum arabic, polyvinyl alcohol, carboxymethylcellulose; resorcinol-formaldehyde wall-formers (see U.S. Pat. No. 3,755,190 to Hart et al), isocyanate wall-formers (see U.S. Pat. No. 3,914,511 to Vassiliades) isocyanate-polyol wall-formers (see U.S. Pat. No. 3,796,669 to Kiritani et al) urea-formaldehyde wall-formers and more particularly urea-resorcinol-formaldehyde wall-formers (in which oleophilicity is enhanced by the addition of resorcinol) (see U.S. Pat. Nos. 4,001,140; 4,087,376 and 4,089,802 to Foris et al) melamine-formaldehyde resin and hydroxypropyl cellulose (see commonly assigned U.S. Pat. No. 4,0925,455 to Shackle). Preferred methods are described in U.S. Pat. Nos. 4,772,530 and 4,772,541. A particularly preferred method for preparing microcapsules is described in U.S. application Ser. No. 073,036 filed July 14, 1987.

The imaging sheet used in the present invention can be prepared as described in U.S. Pat. No. 4,399,209 and more particularly, for full color imaging, as described in U.S. Pat. No. 4,772,541.

Thermoplastic developer resins useful in the present invention are described in recently allowed U.S. Pat. application Ser. No. 073,036 filed July 14, 1987 corresponding to European Publication No. 0260129. A preferred example of a developer material useful in the present invention is a phenolic resin. These resins may be the condensation product of phenols (including substituted phenols) and formaldehyde. The phenol formaldehyde molar ratio is usually about 1:1 and the degree of condensation ranges from about 2 to 50, but is generally about 4 to 10. The resins may be further modified to include amounts of salicylic acids or substituted salicylic acids in a manner known in the art. Examples of other thermoplastic phenolic resins useful in the present invention are described in U.S. Pat. Nos. 3,455,721; 3,466,184; 3,672,935; 4,025,490; 4,226,962; and 4,647,952.

The phenolic developers are preferably metallated to improve their developing characteristics. This also enhances their thermoplastic character as thermolabile ionic bonds are formed which dissociate and yield lower molecular weight species upon heating and associate into higher molecular weight species upon cooling. The resins may be metallated by reaction with a salt selected from the group consisting of copper, zinc, aluminum, tin, cobalt and nickel. Most typically, the resins are zincated to improve development. The metal content of the resins generally is about 1 to 5%by weight but may range up to 15%.

Representative examples of these phenolic resins are as follows: p-phenylphenol-formaldehyde polymer, p-fluorophenol-formaldehyde polymer, p-chlorophenol-formaldehyde polymer, p-bromophenol-formaldehyde polymer, p-iodophenol-formaldehyde polymer, p-nitrophenol-formaldehyde polymer, p-carboxyphenol-formaldehyde polymer, p-carboalkoxyphenol-formaldehyde polymer, p-aroylphenol-formaldehyde polymer, p-lower alkoxyphenol-formaldehyde polymer, p-alkyl($C_1$–$C_{12}$)-phenol-formaldehyde polymers, in which the p-alkyl($C_1$–$C_{12}$)-phenol is p-methylphenol, p-ethylphenol, p-n-propylphenol, p-isopropylphenol, p-t-butyephenol, p-namylphenol, p-isoamylphenol, p-cyclohexylphenol, p-1,1-dimethyl-n-propylphenol, p-n-hexylphenol, p-isohexylphenol, p-1,1-dimethyl-n-butylphenol, p-1,2-dimethyl-n-butylphenol, p-n-heptylphenol, p-isoheptylphenol, p-5,5-dimethyl-n-amylphenol, p-1,1-dimethyl-n-amylphenyl, p-n-octylphenol, p-1,1,3,3-tetramethylbutylphenol, p-isooctylphenol, p-n-nonylphenol, p-isononylphenol, p-1,1,3,3-tetramethylamylphenol, p-n-decylphenol, p-isodecylphenol, p-n-undecylphenol, p-isoundecylphenol, dodecylphenol, etc., and polymers of formaldehyde and isomers of these p-alkyl-phenols where the alkyl groups have 1 to 12 carbon atoms, and copolymers of formaldehyde and mixtures containing two or more of these alkylphenols and the isomers thereof.

More particularly, alkylphenolic resins and, still more particularly, metallated products of alkylphenolic resins are used. The alkyl phenols are monosubstituted by an alkyl group which may contain 1 to 12 carbon atoms. Examples of alkylphenols are ortho- or para- substituted ethylphenol, propylphenol, butylphenol, amylphenol, hexylphenol, heptylphenol, octylphenol, nonylphenol, t-butylphenol, t-octylphenol, etc.

A preferred class of thermoplastic transferrable developer resin is a resin-like condensation product of a polyvalent metal salt, such as a zinc salt, and a phenol, a phenolformaldehyde condensation product, or a phenol-stalicylic acid-formaldehyde condensation product. This type of developer material is available from Schenectady Chemical Co. under the designation HRJ 4250, HRJ 4252, and HRJ 4542. These products are reported to be a metallated condensation product of an ortho- or para-substituted alkylphenol, a substituted salicylic acid, and formaldehyde.

Certain functionalized arcylic or vinylic resins are also useful as developer resins in the present invention. These resins may be admixed with phenolic resins or used alone. Examples of these resins are described in U.S. Pat. Nos. 4,853,364 and 4,877,767. These resins are preferably prepared by an emulsion polymerization process. The process is preferably controlled through monomer and catalyst addition to provide a particle having a core with a lower melt flow temperature and a lower minimum film forming temperature than the shell. For example, the core shell particle may have a nominal melt flow temperature of 80° to 130° C. and the core having a somewhat lower MFT.

also useful in the present invention are blends of acrylic and phenolic developers as described in U.S. Pat. No. 4,853,364. The reader is directed to the examples of this patent which illustrate compositions which are also useful herein.

The foregoing resins may be used in the form of a film in which case they will be coated on the support for the developer-donor from a solution of the resin. Preferably, however, these resins are used as a finely divided particle. In one case they can be coated from an aqueous emulsion, in other cases known wet and dry milling techniques may be used to prepare resin particles for coating.

In selecting the developer resin, it is essential that under the conditions which exist at the time of transfer (e.g., temperature and pressure), the adhesive strength of the developer to paper is greater than the adhesive strength of the developer to the developer-donor web. Similarly, the developer layer must be sufficiently adherent to the developer-donor web that it does not adhere to the imaging sheet in nip 67.

By carefully controlling the adhesive strength of the developer layer for the developer-donor web it is also possible to selectively transfer the imaged areas of the developer layer without transferring the non-imaged or background areas. As noted in U.S. Pat. No. 4,701,397, it has been found that the internal phase of the microcapsules which is transferred to the developer layer plasticizes the developer layer and renders it more adhesive to paper and less adhesive to the developer-donor web. In this case, if the adhesive strength of the non-image areas to the developer-donor web is great enough, only the image areas can be transferred. This is advantageous because it gives an "engraved" look and feel to text and it preserves the whiteness of the background.

The developer-donor sheet of the present invention is prepared by coating a support with a coating composition of the developer material using conventional coating techniques. The developer material is usually applied to the surface of the support in an amount of about 8 to 15 g/m$^2$ depending upon the nature of the developer, whether it is encapsulated and whether it is present in a binder or not.

Photocopy apparatuses useful in practicing the method of the present invention can be constructed by modifying known, commercially available, color copiers such as the Noritsu® Slide Printer, the Renaissa CC5500® from Brother Industries or the Cycolor® Copier from Seiko-Mead.

Having described the invention in detail and by reference to preferred embodiments thereof, it will be apparent that modifications and variations are possible without departing from the scope of the appended claims.

What is claimed is:

1. A process for forming images on a non-reactive substrate comprising the steps of:

image-wise exposing an imaging sheet, said imaging sheet comprising a support having a layer of photosensitive microcapsules on the surface thereof, said microcapsules containing a photohardenable or photosoftenable composition and a color precursor;

assembling said image-wise exposed imaging sheet with a developer-donor sheet, said developer-donor sheet including a web having a layer of a thermoplastic developer resin on the surface thereof, said resin being capable of reacting with a color precursor to form an image;

subjecting said assembly to said imaging sheet and said developer-donor sheet to a uniform rupturing force to cause said photosensitive microcapsules to rupture and transfer an image-wise pattern to said color precursor to said developer layer thereby forming an image thereon;

Separating said imaging sheet from said developer-donor sheet;

assembling said developer-donor sheet bearing said image with a non-reactive substrate to form a second assembly; and subjecting said second assembly to heat and a uniform force to transfer said developer to said non-reactive substrate.

2. The process of claim 1 wherein said thermoplastic developer resin is a phenolic resin.

3. The process of claim 2 wherein said web is a plastic film.

4. The process of claim 3 wherein said plastic film has a thickness of about 5 to 100 microns.

5. The process of claim 1 wherein said microcapsules contain a photohardenable composition.

6. The process of claim 2 wherein said phenolic resin is a metallated phenolic resin.

7. The process of claim 6 wherein said phenolic resin is a zincated phenolic resin.

8. The process of claim 1 wherein said developer resin is an acrylic or vinylic resin.

9. The process of claim 1 wherein said developer resin is a blend of a phenolic resin and an acrylic or vinylic resin.

10. The process of claim 1 wherein said non-reactive substrate is xerographic bond paper.

11. The process of claim 1 wherein said non-reactive substrate is magazine stock.

12. The process of claim 1 wherein said non-reactive substrate is a transparent plastic film and said process is useful in forming transparencies.

13. The process of claim 1 wherein said imaging sheet is sensitive to visible light.

14. The process of claim 2 wherein said developer resin is present in the form of finely divided particles.

* * * * *